United States Patent [19]

Kent

[11] Patent Number: 5,787,577
[45] Date of Patent: Aug. 4, 1998

[54] METHOD FOR ADJUSTING AN ELECTRONIC PART TEMPLATE

[75] Inventor: Kevin L. Kent, Woodstock, Ill.

[73] Assignee: Motorola, Inc., Schaumburg, Ill.

[21] Appl. No.: 698,632

[22] Filed: Aug. 16, 1996

[51] Int. Cl.$^6$ .................................................. H05K 3/30
[52] U.S. Cl. ............................... 29/833; 29/721; 29/834
[58] Field of Search ........................... 29/833, 721, 740, 29/832, 834, 836

[56] References Cited

U.S. PATENT DOCUMENTS

| | | |
|---|---|---|
| 4,980,971 | 1/1991 | Bartschat et al. .................. 29/833 |
| 5,113,565 | 5/1992 | Cipolla et al. ..................... 29/833 |
| 5,317,802 | 6/1994 | Jyoko ................................ 29/832 |
| 5,384,956 | 1/1995 | Sakurai et al. .................... 29/740 |
| 5,400,497 | 3/1995 | Watanabe et al. ................. 29/740 |

*Primary Examiner*—Peter Vo
*Assistant Examiner*—Rick Kiltae Chang
*Attorney, Agent, or Firm*—Mark D. Patrick

[57] ABSTRACT

A method for adjusting an electronic part template corresponding to an electronic part that is to be placed on a substrate includes capturing an image of the electronic part, calculating a dimension of the electronic part from the image, and adjusting the electronic part template according to the dimension. This dynamic adjustment of the electronic part template helps to reduce excessive rejection rates due to slight mechanical differences among functionally equivalent electronic parts supplied by different suppliers.

11 Claims, 3 Drawing Sheets

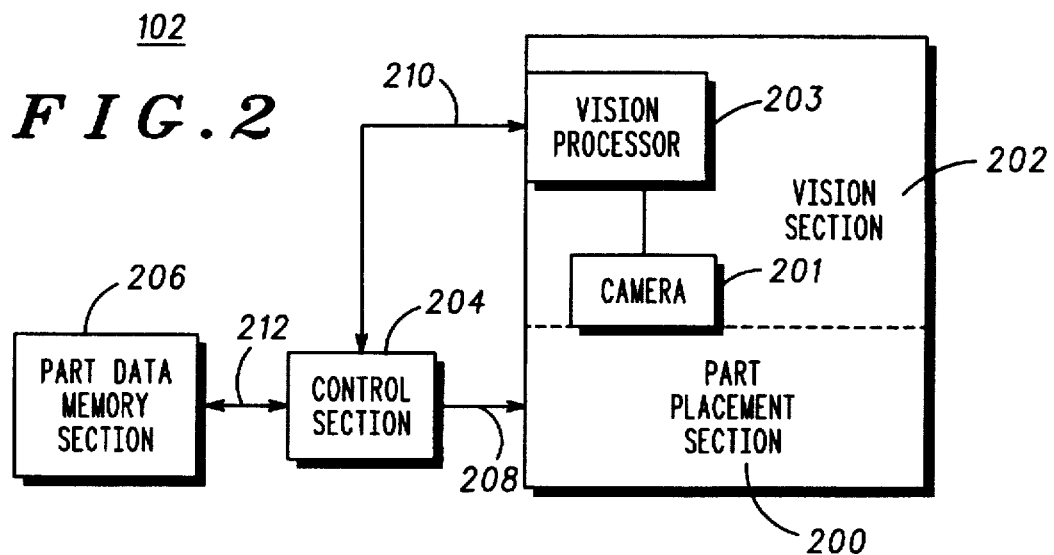
FIG. 2
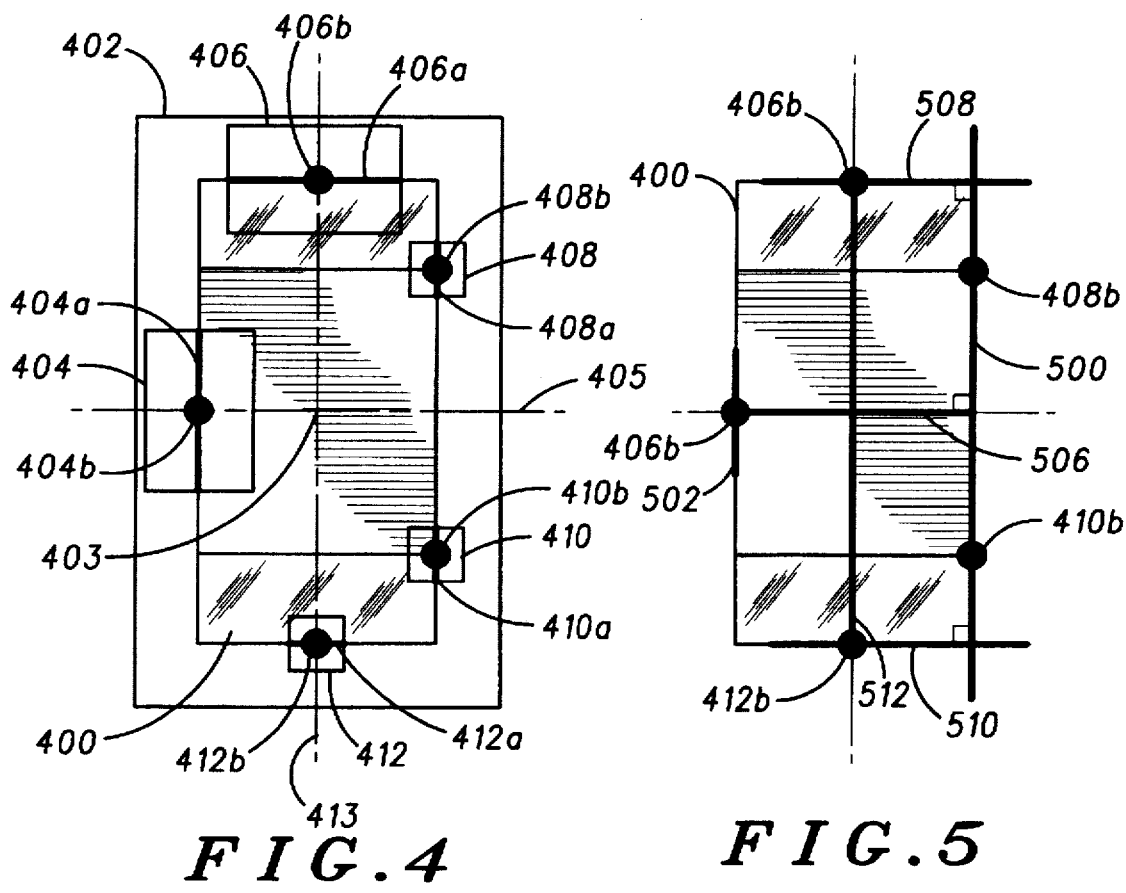
FIG. 4
FIG. 5

METHOD FOR ADJUSTING AN ELECTRONIC PART TEMPLATE

FIELD OF THE INVENTION

The present invention relates generally to electronic parts and more specifically to electronic parts data used by a part placement machine to mount electronic parts on a substrate.

BACKGROUND OF THE INVENTION

In a quality controlled electronic parts placement process, electronic parts are inspected by a vision system including a camera prior to placement on a substrate, such as a printed circuit board, by a part placement machine. The vision system determines whether to discard or use each electronic part based on an image of the part and a corresponding pre-stored electronic part template. The electronic part template is typically provided by the supplier of the electronic part.

To remain competitive and ensure adequate supply of parts, it is necessary to use more than one supplier for an electronic part. However, there exists slight mechanical differences among the same functional electronic parts supplied by different suppliers. As a result, the decision to use or discard an electronic part from one supplier can be based on an electronic part template provided by another supplier. This causes excessive rejection rates if acceptable parts from one supplier are discarded when they do not conform to the specifications of another supplier. Excessive rejection rates seriously impact capacity and throughput for an automated assembly system. Therefore, what is needed is an apparatus and method for accommodating parts supplied by different suppliers.

BRIEF DESCRIPTION OF THE DRAWINGS

FIG. 2 is a block diagram functionally illustrating the part placement machine of FIG. 1;

FIG. 4 is a plan view illustrating an image of an electronic part captured by the vision section of FIG. 1; and FIG. 5 is a plan view illustrating calculated dimensions of the image of FIG. 4.

DETAILED DESCRIPTION OF THE PREFERRED EMBODIMENTS

An apparatus for adjusting an electronic part template of an electronic part assembly system includes a memory section and a vision section. The memory section contains data representing the electronic part template. The vision section is coupled to the memory section and captures an image of the electronic part prior to placement. The vision section calculates one or more dimensions of the electronic part from the image. The data in the memory section representing the electronic part template is adjusted based on the calculated dimension. By calculating dimensions of the electronic part and dynamically changing the electronic part template based on the calculated dimensions, excessive rejection rates due to slight mechanical differences among functionally equivalent electronic parts supplied by different suppliers are reduced.

Figure 1:
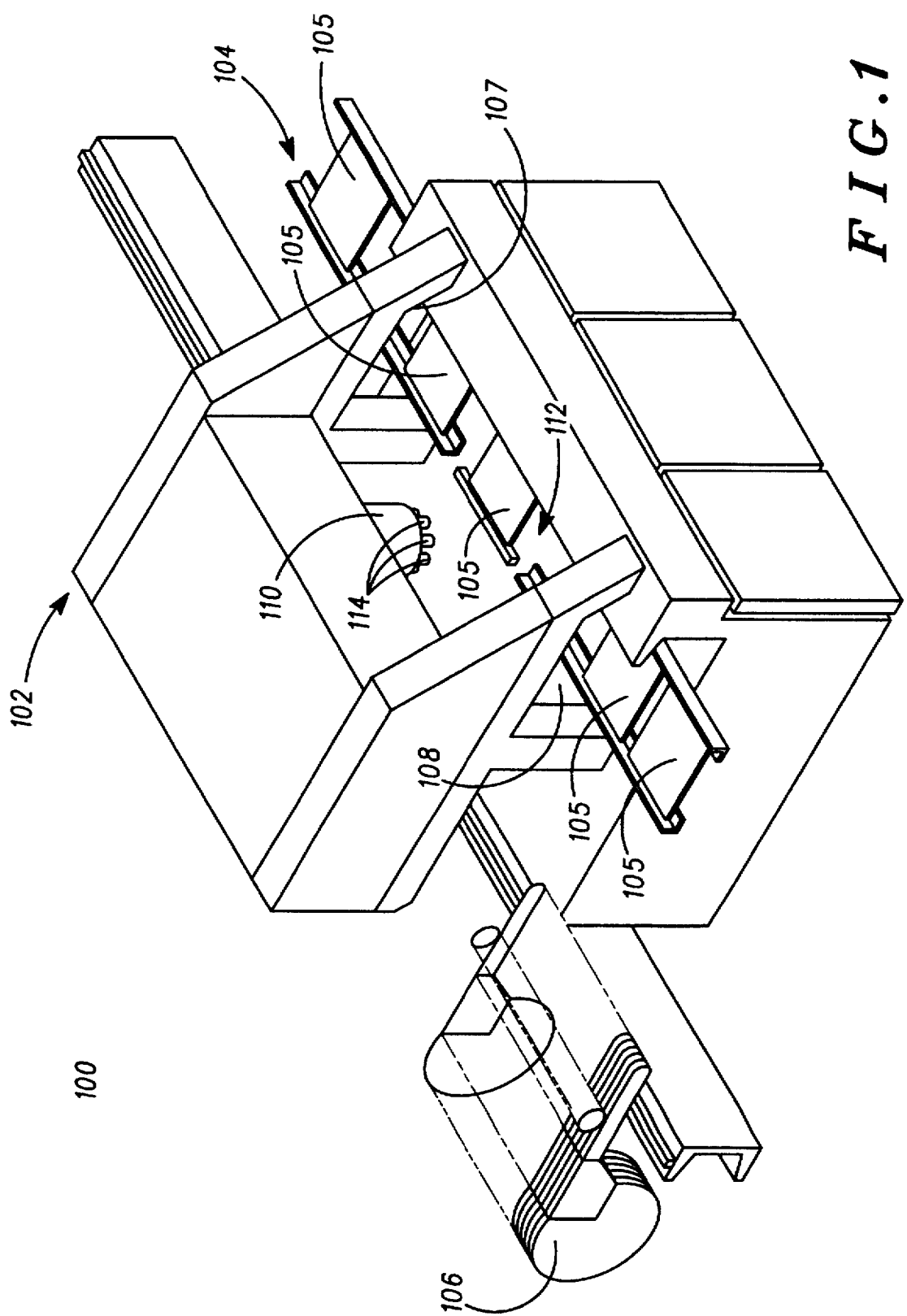
FIG. 1 is a perspective view illustrating a part placement machine employing a vision section.

FIG. 1 illustrates a section of assembly line 100. The section of assembly line 100 includes a part placement machine 102 and a conveyance 104. The part placement machine 102 includes side openings 107 and 108 that permit extension of the conveyance 104 into the part placement machine 102. The conveyance 104 transports substrates 105, such as printed circuit boards. The substrates 105 enter the part placement machine 102 via the conveyance 104 and the side opening 107.

The part placement machine 102 comprises a part placement section 200 (FIG. 2), a vision section 202, a control section 204, and a memory section 206. The control section 204 controls the operation of the part placement machine 102. The control section 204 comprises one or more commercially available microprocessors that execute predetermined instructions and one or more commercially available memory elements (not shown), separate from the memory section 206, that store the instructions.

The part placement section 200 comprises tape reels 106 (FIG. 1). Each one of the tape reels 106 contains a plurality of functionally equivalent electronic parts supplied by one supplier. When a reel of parts is exhausted, the used reel is replaced by a new reel full of parts. Although the parts are functionally equivalent, the new reel may be from a different supplier. As used herein, functionally equivalent parts are those parts that are operable to substantially similar electrical specifications. The electronic parts supplied by different suppliers may have slight mechanical differences. Such mechanical differences include weight, size, composition, or the like.

Data representing an electronic part template for each type of art contained in the tape reels 106 is stored in the memory section 206 FIG. 2). The memory section 206 comprises any suitable commercially available storage medium, such as random-access memory (RAM), floppy or magnetic disk, read/write compact disk (CD) read-only memory (ROM), or the like. The memory section 206 holds the data representing only one electronic part template for each type of electronic part. Each electronic part template defines dimensional characteristics of an electronic part, such as its length and width. Data comprising each electronic part template is manually entered into the memory section 206 to reflect the mechanical specifications of the electronic part of one supplier. Once entered, the electronic part template is not adjusted and remains in the memory section 206 until it is removed.

The part placement section 200 includes a placement table 112 (FIG. 1). The placement table 112 is for positioning one or more of the substrates 105 delivered by the conveyance 104 for part placement. Part placement is a procedure by which the part placement machine 102 selectively removes electronic parts from the tape reels 106 and places them at predetermined locations on the substrates 105 positioned on the placement table 112. For each electronic part to be placed, the control section 204 controls the part placement machine 102 to perform the procedure illustrated in FIG. 3.

The part placement section 200 (FIG. 2) includes a placement head 110 (FIG. 1) having suction nozzles 114. In response to instructions received from the control section 204 (FIG. 2) via bus 208, the placement head 110 (FIG. 1) directs one of the nozzles 114 to pick an electronic part from one of the tape reels 106 (at block 300 of FIG. 3).

The vision section 202 (FIG. 2) includes a camera, such as camera 201, disposed in each of the nozzles 114 (FIG. 1) and a vision processor 203 (FIG. 2) that operates the vision section 202 in response to instructions received from the control section 204 via bus 210. The camera disposed in the nozzle holding the picked electronic part captures a twodimensional image 400 (FIG. 4) of the picked electronic part (at block 302 of FIG. 3). The vision processor 203, which may be any suitable commercially available microprocessor, converts the image 400 from binary form into grayscale form. The control section 04 reads the electronic part template corresponding to the picked electronic part from the memory section 206 via bus 212 and couples it to the vision processor 203 of the vision section 202 (FIG. 2) via bus 210 (at block 304 of FIG. 3). The vision processor 203 generates a tolerance window 402 (FIG. 4) based on the dimensions in the electronic part template (at block 306 of FIG. 3). In the illustrated embodiment, the vision processor 203 sets the length and width of the tolerance window 402 to be approximately 0.3 mm larger than the corresponding dimensions in the electronic part template. The vision processor 203 accepts or rejects the picked electronic part based on the fit of the image 400 within the tolerance window 402 (at block 308 of FIG. 3). If the vision processor 203 detects any points that the image 400 overlaps the tolerance window 402, a discard signal is sent to the control section 204 via bus 210. The part placement section 200 discards the picked electronic part responsive to instructions sent by the control section 204 on bus 208 (at block 310 of FIG. 3). Once discarded, the control section 204 ends the procedure of FIG. 3 (at block 312 of FIG. 3).

If the vision processor 203 does not detect any points of overlap between the tolerance window 402 (FIG. 4) and the image 400, the electronic part is accepted. If accepted, the vision processor 203 detects a predetermined number of points along the edges of the image 400 (at block 314 of FIG. 3). The vision processor 203 employs a known edge detection algorithm that detects edges by grayscale contrasting of the image 400 of the picked electronic part against a white background. The vision processor 203 initially approximates a center 403 (FIG. 4) of the image 400 based on the electronic part template. The vision processor 203 translates leftward along a transverse axis 405 of the image 400 from the center 403 one-half of the width defined by the electronic part template to a left edge of the image 400. At the left edge, the vision processor 203 generates a target window 404 and a best fit line 404a therein that describes a greatest gradient change in contrast between the left edge of the image 400 and the background. The vision processor 203 detects an edge point 404b at the midpoint of the best fit line 404a. The vision processor 203 sizes the target window 404 sufficiently large to ensure detection of the edge point 404b in situations when the image 400 is skewed because the picked electronic part held in the nozzle is rotated.

Because the edge point 404b may not define a midpoint of the length of the image 400, additional edge points must be calculated. Using the edge point 404b, the vision processor 203 generates additional edge points 406b, 408b, 410b, and 412b via respective target windows 406, 408, 410, and 412 and respective best fit lines 406a, 408a, 410a, and 412a. Once an edge point of each dimension of the image 400 is detected (i.e., edge points 404b and 406b), the remaining edge points may be accurately detected with a comparatively smaller target window. From edge point 404b, the vision processor 203, first, translates rightward along the transverse axis 405 one-half of the width and, second, translates upward along a longitudinal axis 413 of the image 400 one-half of a length defined by the electronic part template to a top edge of the image 400. At the top edge, the vision processor 203 generates the target window 406 and best fit line 406a, and detects edge point 406b. From edge point 406b, the vision processor 203 translates downward along the longitudinal axis 413 one-quarter of the length and rightward parallel to the transverse axis 405 one-half of the width to a top right edge of the image 400. At the top right edge, the vision processor 203 generates the target window 408 and best fit line 408a, and detects edge point 408b. From edge point 408b, the vision processor 203 translates downward parallel to the longitudinal axis 413 one-half of the length to a bottom right edge. At the bottom right edge, the vision processor 203 generates the target window 410 and best fit line 410a, and detects edge point 410b. From edge point 410b, the vision processor 203 translates leftward parallel to the transverse axis 405 one-half of the width and downward along the longitudinal axis 413 one-quarter of the length to the bottom edge. At the bottom edge, the vision processor 203 generates the target window 412 and best fit line 412a, and detects edge point 412.

Figure 3:
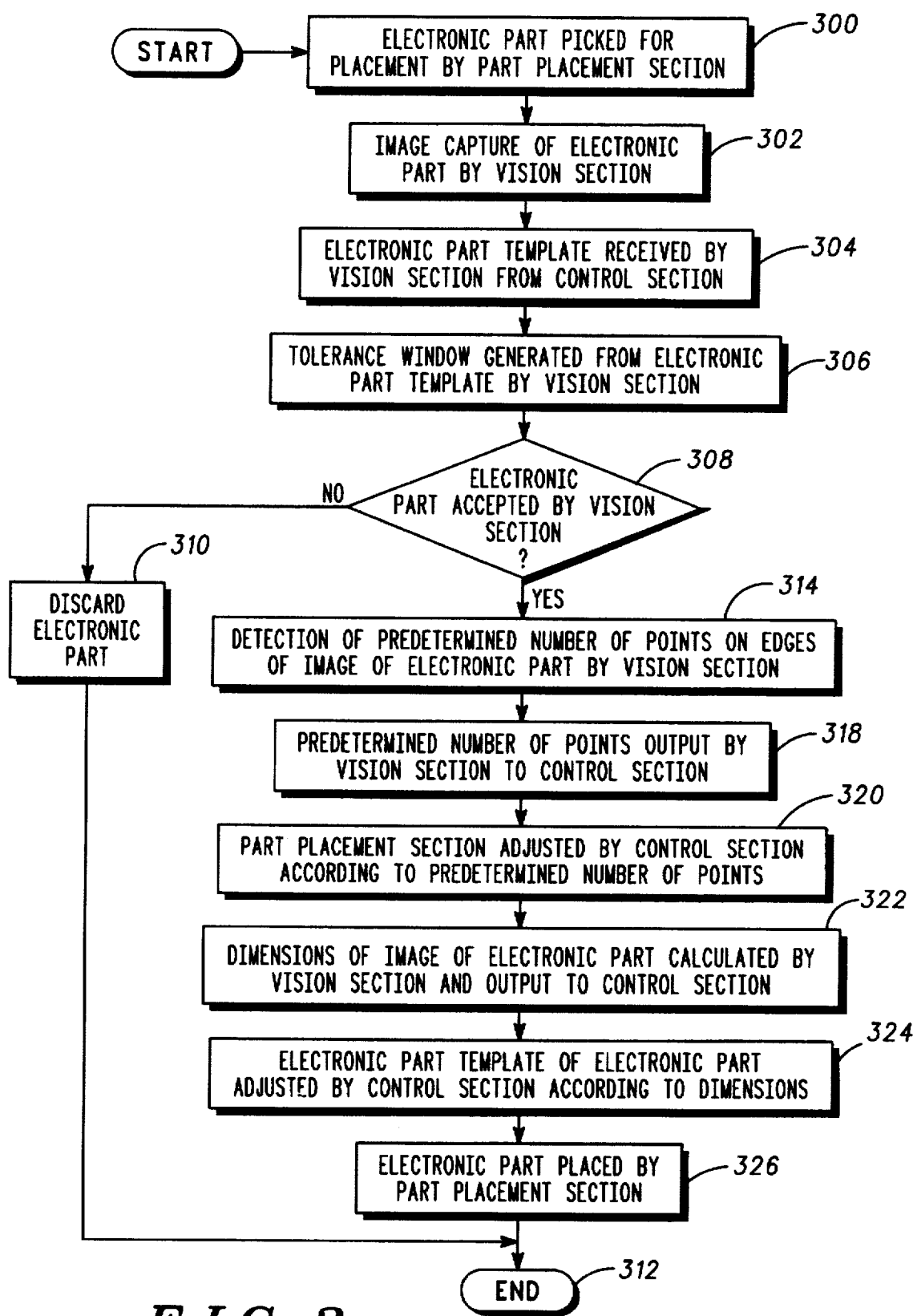
FIG. 3 is a flow chart illustrating the operation of the part placement machine of FIG. 1.

Once detected, the vision processor 203 outputs the edge points 404b, 406b, 408b, 410b, and 412b to the control section 204 (FIG. 2) via bus 210 (at block 318 of FIG. 3). The control section 204 (FIG. 2) determines the orientation of the picked electronic part held in the nozzle from the edge points 404b, 406b, 408b, 410b, and 412b and, accordingly, adjusts the placement head 110 (FIG. 1) of the part placement section 200 (FIG. 2) via instructions sent on bus 208 (at block 320 of FIG. 3). This ensures accurate placement of the picked electronic part.

Rather than just determining whether to accept or reject the picked electronic part, and whether to adjust the placement head 110 (FIG. 1), the vision processor 203 (FIG. 2) of the vision section 202 also calculates the dimensions of the image 400 (FIG. 5) (at block 322 of FIG. 3). An actual width of the image 400 is calculated in the following manner. The vision processor 203 generates a line segment 500 (FIG. 5) by imposing a straight line through the points 408b and 410b. The vision processor 203 next generates a line segment 502 by imposing a straight line, parallel to the line segment 500, through the point 406b. The vision processor 203 calculates the actual width of the image 400 by imposing a line segment 506 orthogonally from the line segment 500 at a point equidistant the points 408b and 410b to the line segment 502. The vision processor 203 defines the actual width of the image 400 as the length of line segment 506.

An actual length of the image 400 is calculated in the following manner. The vision processor 203 generates a line segment 508 by imposing a straight line through the point 406b so as to intersect the line segment 500 at a right angle. The vision processor 203 generates a line segment 510 by imposing a straight line through the point 412b so as to intersect the line segment 500 at a right angle. The vision processor 203 calculates the actual length of the image 400 by imposing line segment 512 between the edge points 406b and 412b and parallel a the line segment 500. The vision processor 203 defines the actual length of the image 400 as the length of the line segment 512.

The vision processor 203 outputs the calculated actual length and width of the image 400 to the control section 204 via bus 210 (at lock 322 of FIG. 3). Upon reception of the calculated length and width from the vision section 202 (FIG. 2), the control section 204 adjusts the data representing electronic part template of the picked electronic part stored in the memory section 206 (at block 324 of FIG. 3). The control section 204 (FIG. 2) replaces, via bus 212, corresponding dimensions of the electronic part template stored in the memory section 206 with the newly calculated dimensions of the picked electronic part provided by the vision section 202.

This dynamic adjustment varies the electronic part template thereby allowing variation in the size of the tolerance window 402 (FIG. 4) for subsequent ones of the same picked electronic part. The dynamic adjustment does not mitigate accuracy or quality in an assembly system because the electronic part template is adjusted based on electronic parts that are found to be acceptable according to prior acceptable electronic parts. This creates an electronic part template that more accurately reflects the actual, acceptable electronic parts being used and, thereby, minimizes excessive rejection rates caused by functionally equivalent, but slightly dimensionally different, electronic parts provided by different suppliers.

To further enhance dynamic adjustment, the control section 204 (FIG. 2) adjusts the electronic part template in the memory section 206 only after receiving dimensions from a predetermined number, or sampling size, of the same electronic part from the vision section 202 and determining average dimensions from the predetermined sampling size. The control section 204 replaces corresponding dimensions of the electronic part template stored in the memory section 206 with the average dimensions. The control section 204 continuously repeats the process of gathering a predetermined sampling size of dimensions from the vision section 202, determining average dimensions therefrom, and storing the average dimensions in the memory section 206. By employing this process, the electronic part template reflects a statistical average of the dimensions of electronic parts within each predetermined sampling size. By only adjusting the memory section 206 periodically (i.e., after each sampling size), loading on the control section 204 is minimized.

Once the memory section 206 has been adjusted, the picked electronic part is placed by the part placement section 200 on a substrate positioned on the placement table 112 (FIG. 1) (at block 326 of FIG. 3). Once placed, the control section 204 (FIG. 2) ends the procedure (at block 312 of FIG. 3). Once electronic parts have been placed at all of the predetermined locations on the substrate, the substrate exits the part placement machine 102 via the side opening 108 and the conveyance 104.

Although a part placement machine 102, such as, for example, a model FCP-VI manufactured and sold by Fuji Machine Manufacturing Co., is illustrated and described, it will be recognized that the apparatus and method described herein can find application in a variety of other machines utilized in the manufacturing environment that would benefit from dynamic adjustment of prestored dimensions of articles. These other machines include laser marking machines, automated optical inspection machines, screen printing machines, automated labeling machines, or the like.

Thus it can be seen that an electronic part template of an electronic part assembly system can be dynamically varied. By calculating the dimensions of the picked electronic part prior to placement, the electronic part template can be adjusted to more accurately reflect the scope of acceptable electronic parts. This permits use of functionally equivalent, but slightly dimensionally different, electronic parts provided by different suppliers without fear of excessive electronic part rejection rates and reductions in quality control.

What is claimed is:

1. A method for adjusting an electronic part template corresponding to an electronic part, the electronic part for placement on a substrate, the method comprising the steps of:

loading the electronic part template corresponding to the electronic part, the electronic part template having a plurality of dimensions;

generating a tolerance window based on the plurality of dimensions of the electronic part template;

capturing an image of the electronic part;

determining overlap of the image and the tolerance window;

accepting the electronic part when no overlap is determined;

calculating at least one dimension of the electronic part from the image;

adjusting the electronic part template according to the at least one dimension; and discarding the electronic part when overlap is determined.

2. The method according to claim 1 wherein the step of calculating follows the step of accepting the electronic part.

3. A method for adjusting an electronic part template corresponding to an electronic part, the electronic part for placement on a substrate, the method comprising the steps of:

capturing an image of the electronic part;

detecting, in the image, a predetermined number of points along edges of the electronic part, wherein the step of detecting, in the image, a predetermined number of points further comprises the steps of:

approximating a center of the electronic part in the image;

translating from the center in a first direction along a first axis for a first distance to a first edge of the electronic part in the image;

generating a first target window at the first edge;

generating a first best fit line along the first edge in the first target window; and detecting a first one of the predetermined number of points at a first midpoint of the first best fit line;

calculating at least one dimension of the electronic part from the image by imposing a plurality of line segments between at least some of said predetermined number of points; and adjusting the electronic part template according to the at least one dimension.

4. The method according to claim 3 wherein the step of detecting, in the image, a predetermined number of points further comprises the steps of:

translating from the first edge in a second direction along the first axis for the first distance;

translating in a third direction along a second axis for a second distance to a second edge of the electronic part in the image;

generating a second target window at the second edge;

generating a second best fit line along the second edge in the second target window; and detecting a second one of the predetermined number of points at a second midpoint of the second best fit line.

5. The method according to claim 4 wherein the step of detecting, in the image, a predetermined number of points further comprises the steps of:

translating from the second edge in a fourth direction along the second axis for a third distance;

translating in the second direction for the first distance to a third edge of the electronic part in the image;

generating a third target window at the third edge;

generating a third best fit line along the third edge in the third target window; and detecting a third one of the predetermined number of points at a third midpoint of the third best fit line.

6. The method according to claim 5 wherein the step of generating the third target window comprises the step of generating the third target window to be smaller than the first and second target windows.

7. The method according to claim 5 wherein the step of detecting, in the image, a predetermined number of points further comprises the steps of:

translating in the fourth direction along the third edge for the second distance;

generating a fourth target window at the third edge;

generating a fourth best fit line along the third edge in the fourth target window; and detecting a fourth one of the predetermined number of points at a fourth midpoint of the fourth best fit line.

8. The method according to claim 7 wherein the step of detecting, in the image, a predetermined number of points further comprises the steps of:

translating in the first direction from the third edge for the first distance to the second axis;

translating in the fourth direction along the second axis for the third distance to a fourth edge of the electronic part in the image;

generating a fifth target window at the fourth edge;

generating a fifth best fit line along the fourth edge in the fifth target window; and detecting a fifth one of the predetermined number of points at a fifth midpoint of the fifth best fit line.

9. A method for adjusting an electronic part template corresponding to an electronic part, the electronic part for placement on a substrate, the method comprising the steps of:

capturing an image of the electronic part;

detecting, in the image a predetermined number of points along edges of the electronic part;

calculating at least one dimension of the electronic part from the image by imposing a plurality of line segments between at least some of said predetermined number of points;and adjusting the electronic part template according to the at least one dimension.

10. The method according to claim 9 wherein the step of calculating further comprises the steps of:

extending a first line segment of the plurality of line segments through first and second points of the predetermined number of points on a first edge of the electronic part in the image;

extending a second line segment of the plurality of line segments through a third one of the predetermined number of points on a second edge of the electronic part in the image; and extending a third line segment of the plurality of line segments between the first line segment at a midpoint thereof to the second line segment, a length of the third line segment defining a first one of the at least one dimension.

11. The method according to claim 10 wherein the step of calculating further comprises the steps of:

extending a fourth line segment of the plurality of line segments through a fourth point of the predetermined number of points on a third edge of the electronic part in the image, the fourth line segment orthogonally intersecting the first line segment;

extending a fifth line segment of the plurality of line segments through a fifth point of the predetermined number of points on a fourth edge of the electronic part in the image, the fifth line segment orthogonally intersecting the first line segment; and extending a sixth line segment of the plurality of line segments between the fourth and fifth line segments, a length of the sixth line segment defining a second one of the at least one dimension.

* * * * *